(12) United States Patent
Munz et al.

(10) Patent No.: US 6,542,948 B1
(45) Date of Patent: Apr. 1, 2003

(54) BUS SYSTEM AND METHOD OF DIAGNOSING SUBSCRIBERS INTERCONNECTED VIA SAID BUS-SYSTEM

(75) Inventors: Juergen Munz, Leinfelden (DE); Harald Eisenhardt, Rutesheim (DE)

(73) Assignee: GKR Gesellschaft fur Fahrzeugklimaregelung MBH, Schwieberdingen (DE)

(*) Notice: Subject to any disclaimer, the term of this patent is extended or adjusted under 35 U.S.C. 154(b) by 0 days.

(21) Appl. No.: 09/180,696
(22) PCT Filed: Apr. 3, 1997
(86) PCT No.: PCT/DE97/00676
§ 371 (c)(1),
(2), (4) Date: Mar. 24, 1999
(87) PCT Pub. No.: WO97/43657
PCT Pub. Date: Nov. 20, 1997

(30) Foreign Application Priority Data

May 14, 1996 (DE) .......................... 196 19 441

(51) Int. Cl.⁷ .......................... G06F 13/00; G06F 11/00
(52) U.S. Cl. .......................... 710/110; 714/43
(58) Field of Search .......................... 710/100, 110; 714/25, 30, 32, 43

(56) References Cited

U.S. PATENT DOCUMENTS

| 4,862,069 A | 8/1989 | Albee |
| 4,951,283 A | 8/1990 | Mastrocola et al. |
| 5,499,336 A | 3/1996 | Preis et al. |
| 5,793,946 A | * 8/1998 | Gauthier et al. ............... 714/25 |
| 6,023,507 A | * 2/2000 | Wookey ...................... 380/285 |

FOREIGN PATENT DOCUMENTS

| EP | 0418665 | 3/1991 |
| WO | WO 8400834 | 3/1984 |
| WO | WO 8605277 | 9/1986 |
| WO | WO 90/09631 | 8/1990 |

* cited by examiner

*Primary Examiner*—Glenn A. Auve
(74) *Attorney, Agent, or Firm*—Kenyon & Kenyon

(57) ABSTRACT

A diagnostic device and a diagnostic method for use with a bus system that includes stations interconnected over a bus, one station of which is set up as the master station and the other stations being slave stations. A diagnosis operation is performed which allows differentiated fault information to be obtained with regard to individual outputs of the stations, where the expenditure for the diagnostic device is low. The diagnosis is achieved by providing a diagnostic device only in the master station, by storing voltage and/or current information on at least one output of at least one slave station to be diagnosed in the diagnostic device, and by performing the diagnosis of the outputs under preselected or preselectable conditions on the basis of a program stored in the master station.

11 Claims, 2 Drawing Sheets

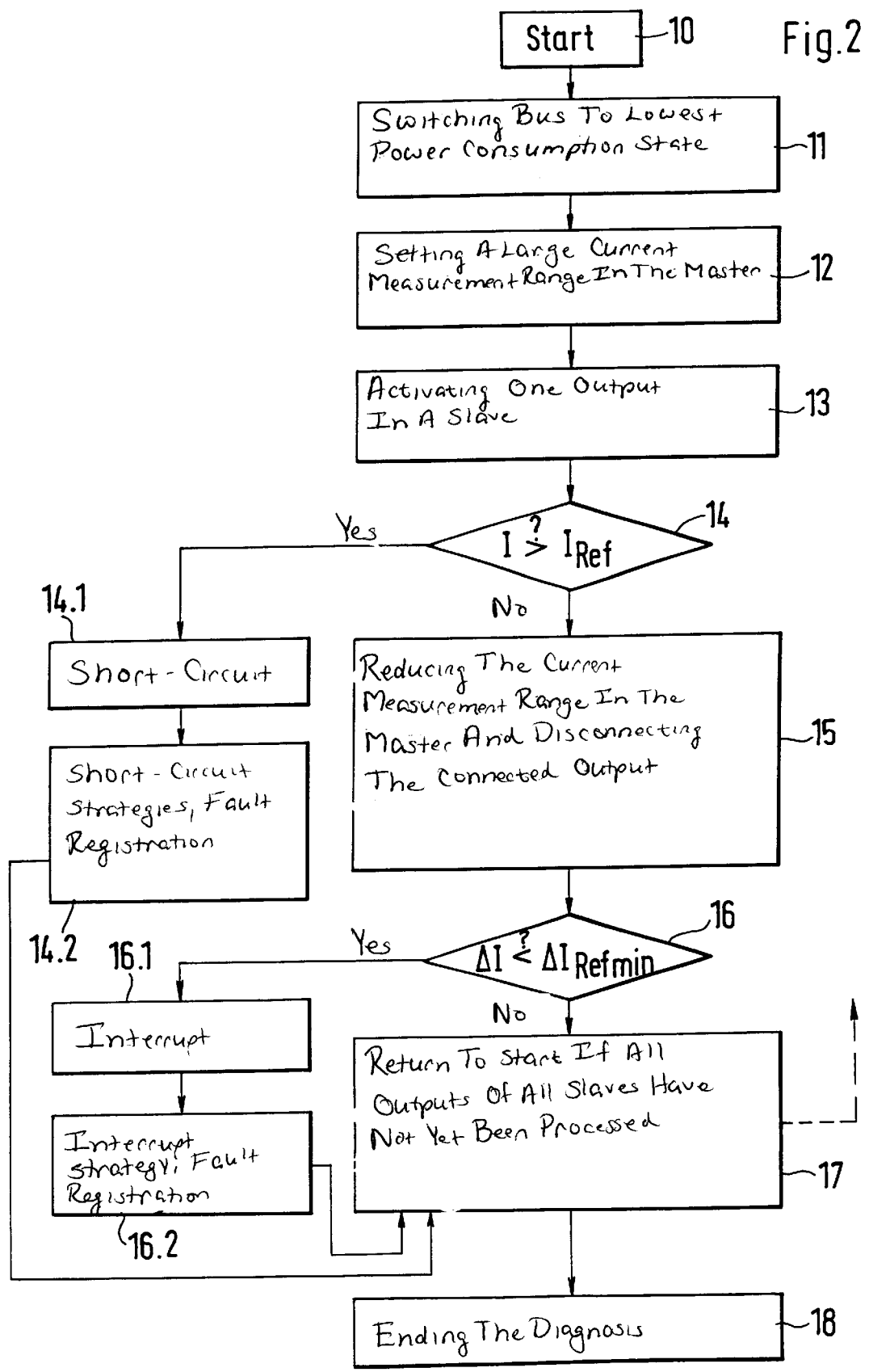

BUS SYSTEM AND METHOD OF DIAGNOSING SUBSCRIBERS INTERCONNECTED VIA SAID BUS-SYSTEM

BACKGROUND INFORMATION

The present invention relates to a bus system with stations interconnected over a bus, one station of which is set up as a master and the other stations being set up as slaves, with a diagnostic device and a method of diagnosing stations interconnected over a bus system, one station of which is set up as a master with the other stations functioning as slaves.

A known bus system and method are described in International Patent No. WO 90/09631. With this known bus system and method, functioning of the data bus and/or functioning of the stations is monitored with the help of fault detection signals in the form of watchdog signals, and in the event of a fault, defined emergency operation modes are initiated, with two different emergency operation modes being implementable. With this fault detection method, signals are periodically sent and received repeatedly, with the stations participating in bus traffic expecting the external fault detection signals within a predetermined time reference. This does not provide for any further fault diagnosis.

SUMMARY OF THE INVENTION

An object of the present invention is to make available a bus system having a plurality of stations and a method of the for diagnosing the outputs of the stations.

According to the present invention, the bus system is designed so that a diagnostic device is provided only in the master; current and/or voltage information from at least one output of at least one slave to be diagnosed is stored in the diagnostic device, and diagnosis of the outputs can be performed under preselected and preselectable conditions on the basis of a program stored in the master.

This method provides for the diagnostic device to have a short-circuit detecting device and an interrupt detection device and for a diagnostic mode to be started for diagnosis at a preselectable time, for the outputs of all slaves to be switched to preselected states according to a program present in the master, and for the outputs that are to be diagnosed to be queried in succession with regard to a short-circuit or an interrupt in the preselected states, with the diagnosis being performed in the master.

With these measures, diagnosis of the stations with regard to various faults can be performed with a simple setup, so that information on the type of fault can be derived and fault strategies aimed at the given type of fault can be implemented. In the entire bus system, the expenditure for the diagnostic device and the related costs fall due only once for the master.

If it is provided that the bus system with the stations and their outputs can be switched into a defined state for diagnosis of a short-circuit or an interrupt, with the current or voltage state prevailing at the output to be diagnosed being detectable and that diagnosis can be performed on the basis of the stored current and/or voltage information and the detected current or voltage state, then differentiated information regarding whether a short-circuit or an interrupt has been detected at a respective output can be obtained. The information stored in the diagnostic device makes it possible to determine the extent of a short-circuit or an interrupt and to coordinate an appropriate fault strategy. For example, it is possible to ascertain in this way whether only part of a winding of a stepping motor is defective.

The diagnostic measures can be performed to advantage with a setup whereby the diagnostic device has a reversible resistance device and/or a reversible measuring amplifier.

According to the present invention, if all stations are run into the lowest power consumption state after the start of the diagnostic mode, with a change in state of the stations being prevented except for the output to be diagnosed, then a definite state of the bus system prevails for performing the diagnosis, so that faults can be detected reliably.

The procedure is advantageous in that the current measurement range of a diagnostic device provided in the master for detecting a short-circuit is set as large as possible and the gain is set as low as possible; then the output to be diagnosed in a slave is turned on, and if a set current for this output is exceeded, a short-circuit is diagnosed. With these measures, the diagnostic device is protected from the risk of damage in the event a short-circuit actually occurs and the high current occurring with it, while the measurement range can then be reduced to detect an incomplete short-circuit.

A sensitivity suitable for detection of an interrupt is achieved, with the sensitivity for detection of different interrupt degrees being incrementally adjustable. If there are also provisions so that the current measurement range in the master is reduced or the gain is increased to detect an interrupt, then the output to be diagnosed is disconnected and an interrupt is diagnosed if the signal detected is below a specified smallest current change.

Furthermore, a systematic diagnosis of the outputs to be tested for short-circuit and interrupt is made possible if the procedure is such that the short-circuit diagnosis and the interrupt diagnosis are performed in succession in this order at all outputs to be diagnosed. The interrupt diagnosis is performed only when no short-circuit has previously been diagnosed at the same output, and the diagnosis is concluded when all the outputs to be diagnosed have been tested.

In the event a fault is detected, the measures are advantageous in that a fault entry is made when a short-circuit is detected in the diagnostic device and a programmed short-circuit strategy is performed, and if an interrupt is detected in the diagnostic device, a fault entry and a programmed interrupt strategy are implemented.

BRIEF DESCRIPTION OF THE DRAWINGS

FIG. 2 shows a flow chart representing a method for diagnosing the bus system of the present invention.

DETAILED DESCRIPTION

Figure 1:
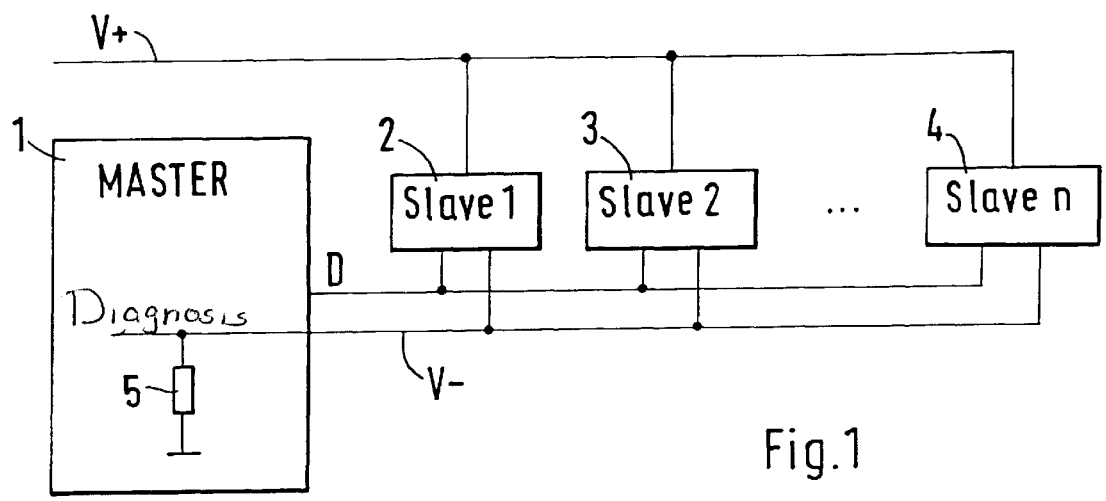
FIG. 1 shows a bus system according to the present invention that includes a plurality of stations connected.

The bus system illustrated in FIG. 1 has a bus with a data line D and a bus power supply V+, V−. A master 1 and slaves 2, 3, 4 are connected to the bus as stations.

A diagnostic device 5 for stations 1, 2, 3, 4 is provided in master 1. As shown in FIG. 1, a selectable number n of slaves may be provided in accordance with the physical possibilities of the bus system.

The diagnostic device is represented symbolically as a resistor, which is to be understood to refer to a suitable measuring device with a suitable resistance arrangement or a measuring amplifier. Diagnostic device 5 also has an analog-to-digital converter (not shown). Diagnostic device 5 is also designed for detecting short-circuits and/or interrupts at some or all outputs of some or all slaves, for which purpose diagnostic device 5 is equipped with a means for measuring current and/or voltage.

FIG. 2 shows a flow chart for a diagnosis. After a start 10, all slaves 2, 3, 4 are put in a state of lowest possible power consumption by a program or protocol in step 11 to permit the greatest possible current resolution. A change in the states of the bus system is suppressed in the diagnostic mode selected in this way. Only the respective output to be tested can be switched. In this state of the lowest possible power consumption, the total power consumption of the bus is constant, e.g., in a range between 150 mA and 250 mA. The diagnostic device knows this value. Under these defined output conditions, a short-circuit or interrupt diagnosis of actuators (e.g., switch outputs, motor windings, etc.) can be performed reliably.

To perform the short-circuit diagnosis, the largest possible measurement range or the lowest possible gain is selected in step 12 in the diagnostic device. In step 13, master 1 activates precisely one output, whose address is also stored in master 1, in precisely one slave. If a specified current is exceeded, a short-circuit is diagnosed in step 14, because a regular current of the respective output is also stored in diagnostic device 5. If the current when the bus is idle is 200 mA and the regular current at the respective output, e.g., a stepping motor winding, is 250 mA, specified current $I_{Ref}$ can be set much higher than the sum of the zero-signal current and the regular current, e.g., 800 mA.

With specified stepped current values and incrementally reduced current measurement ranges or incrementally increased gain, the extent of the short-circuit can be determined more specifically. If it is found in step 14 that specified current $I_{Ref}$ is exceeded, a short-circuit is diagnosed in step 14.1. Then in step 14.2, a fault is entered and, if desired, suitable short-circuit strategies are implemented. For example, if only a partial short-circuit is diagnosed instead of a complete one, the respective output of the respective slave can be operated for a shorter period of time and/or at a lower power in longer intervals.

If the diagnosis shows in step 14 that specified current $I_{Ref}$ has not been exceeded, and if multiple current measurement ranges or gain levels are being processed, then in step 15 an interrupt diagnosis is performed on the same output and the current measurement range is reduced or the gain is increased in diagnostic device 5. The output activated during the short-circuit diagnosis is disconnected. If the current is below a specified least current change $\Delta I_{Refmin}$ in step 16, an interrupt is diagnosed. Least current change $\Delta I_{Refmin}$ and the regular current at the respective disconnected, fault-free input are also known in diagnostic device 5, so that the current change due to the interrupt is detected. Here again, more precise measurements of the extent of the interrupt can be made by gradation of the current measurement ranges and the gain level.

If an interrupt is diagnosed, i.e., the current is below the least specified current change $I_{Refmin}$, then after step 16.1, where the interrupt is diagnosed, a fault entry is made in step 16.2 and optionally a desired interrupt strategy is implemented; this can also be selected according to the extent of the interrupt.

In any case, i.e., when a short-circuit or an interrupt or no fault is detected, the diagnostic procedure is restarted in step 17, until all the outputs to be tested have been processed. Then the diagnosis is concluded in step 18.

Suitable situations where the diagnostic mode is carried out include, for example, start-up of the bus system, before shutdown of the bus system or a test situation in a workshop or by service personnel. If a fault occurs in the bus system, it may also be advantageous for the diagnostic mode to be initiated by a selected program.

On the basis of the faults registered, it is also possible to ascertain over a period of time whether a short-circuit or an interrupt is continuous or just a transient occurrence.

The bus system and diagnostic method described here can be used to advantage in motor vehicles.

What is claimed is:

1. A bus system, comprising:

a bus;

a plurality of slave stations coupled to the bus; and a master station coupled to the bus and including a diagnostic device for storing at least one of current information and voltage information from at least one output of at least one of the plurality of slave stations to be diagnosed, wherein:

the master station stores a program for performing a diagnosis of the at least one output to be diagnosed under a plurality of preselected conditions, the diagnostic device detects at least one of a short-circuit and an interrupt at at least a subset of outputs of at least a subset of the plurality of slave stations in order to perform a diagnosis of the at least one of the short-circuit and the interrupt, each output of the master station and of the plurality of slave stations is switchable to a defined state in which a voltage state and a current state of the at least one output to be diagnosed can be detected, and the diagnosis is performed as a function of at least one of the stored current information and the stored voltage information, and as a function of one of the detected voltage state and the detected current state;

wherein the diagnosis is performed after the master station and each one of the plurality of slave stations are switched to a lowest power consumption state.

2. A bus system, comprising:

a bus;

a plurality, of slave stations coupled to the bus; and a master station coupled to the bus and including a diagnostic device for storing at least one of current information and voltage information from at least one output of at least one of the plurality of slave stations to be diagnosed, wherein:

the master station stores a program for performing a diagnosis of the at leas;t one output to be diagnosed under a plurality of preselected conditions, the diagnostic device detects at least one of a short-circuit and an interrupt at at least a subset of outputs of at least a subset of the plurality of slave stations in order to perform a diagnosis of the at least one of the short-circuit and the interrupt, each output of the master station and of the plurality of slave stations is switchable to a defined state in which a voltage state and a current state of the at least one output to be diagnosed can be detected, and the diagnosis is performed as a function of at least one of the stored current information and the stored voltage information, and as a function of one of the detected voltage state and the detected current state;

wherein the diagnostic device includes at least one of a reversible measuring resistor device and a reversible measuring amplifier.

3. A method for causing a master station coupled to a bus to perform a diagnosis on a plurality of slave stations coupled to the bus, comprising the steps of:

providing a diagnostic mode for the diagnosis at a preselected time;

switching an output of each one of the plurality of slave stations to one of a plurality of preselected states according to a program stored in the master station;

adjusting a gain of the diagnostic device to a value appropriate for diagnosing one of a short-circuit and an interrupt;

for at least one of the plurality of preselected states, querying in succession each output of the plurality of slave stations to be diagnosed with respect to one of a short-circuit and an interrupt by detecting one of a current state and a voltage state present at each output to be diagnosed; and performing the diagnosis as a function of at least one of stored current information and stored voltage information and as a function of one of the detected current state and the detected voltage state.

4. The method according to claim 3, further comprising the steps of:

performing one of (a) and (b):
(a) setting a current measurement range of a diagnostic device provided in the master station for detecting a short-circuit to a large-as-possible value;
(b) setting a gain of the diagnostic device to a low-as-possible value;

activating the output to be diagnosed; and diagnosing the output to be diagnosed as exhibiting the short-circuit if a current specified for the output to be diagnosed is exceeded by a current detected at the output to be diagnosed.

5. The method according to claim 3, wherein in order to detect the interrupt, the method further comprises the steps of:

performing one of (a) and (b):
(a) reducing a current measurement range of the master station;
(b) increasing a gain of the master station;

disconnecting the output to be diagnosed; and diagnosing the interrupt if a change in a current of the output to be diagnosed is below a specified current change minimum value.

6. The method according to claim 3, further comprising the steps of:

performing a short-circuit diagnosis for each output of the plurality of slave stations;

for each output of the plurality of slave stations, performing an interrupt diagnosis in succession with respect to a previously performed short-circuit diagnosis only if the previously performed short-circuit diagnosis did not detect the short-circuit; and terminating each one of the short-circuit diagnosis and the interrupt diagnosis after the output of each slave station has been tested.

7. The method according to claim 3, further comprising the steps of:

when the short-circuit is detected by a diagnostic device of the master station, registering a fault and executing a programmed short-circuit strategy; and when the interrupt is detected by the diagnostic device, registering the fault and executing a programmed interrupt strategy.

8. A method for causing a master station coupled to a bus to perform a diagnosis on a plurality of slave stations coupled to the bus, comprising the steps of:

providing a diagnostic mode for the diagnosis at a preselected time;

switching an output of each one of the plurality of slave stations to one of a plurality of preselected states according to a program stored in the master station;

for at least one of the plurality of preselected states, querying in succession each output of the plurality of slave stations to be diagnosed with respect to one of a short-circuit and an interrupt by detecting one of a current state arid a voltage state present at each output to be diagnosed; and performing the diagnosis as a function of at least one of stored current information and stored voltage information and as a function of one of the detected current state and the detected voltage state;

wherein, after a start of the diagnostic mode, the method further comprises the steps of:
switching the master station and each one of the plurality of slave stations to a lowest power consumption state; and
preventing a change in a state of the master station and each one of the plurality of slave stations except for the output to be diagnosed.

9. A method for causing a master station coupled to a bus to perform a diagnosis on a plurality of slave stations coupled to the bus, comprising the steps of:

providing a diagnostic mode for the diagnosis at a preselected time;

switching an output of each one of the plurality of slave stations to one of a plurality of preselected states according to a program stored in the master station;

switching the master station and each one of the plurality of slave stations to a lowest power consumption state;

for at least one of the plurality of preselected states, querying in succession each output of the plurality of slave stations to be diagnosed with respect to one of a short-circuit and an interrupt by detecting one of a current state and a voltage state present at each output to be diagnosed; and performing the diagnosis as a function of at least one of stored current information and stored voltage information and as a function of one of the detected current state and the detected voltage state.

10. A bus system, comprising:

a bus including a bus power supply; and a plurality of stations interconnected by the bus and coupled to the bus power supply, one station of the plurality of stations being configured as a master, further stations being configured as slaves, the master storing a program and having a diagnostic device coupled to the bus power supply, the diagnostic device storing at least one of current and voltage information from at least one diagnosed output of at least one slave and detecting at least one of a voltage state and a current state present at the diagnosed output that is supplied by the bus power supply, the diagnosis being conductible under specified or specifiable conditions on the basis of the program stored in the master, the diagnosis also being based on the stored at least one of current and voltage information and the detected at least one of current state and voltage state;

wherein the slaves can be switched into a defined state for diagnosis of one of a short-circuit and an interruption in the slaves, the diagnosed output and the outputs that are switched into a defined state being connected to the bus power supply.

11. A method for diagnosing a plurality of stations of a bus system interconnected by a bus having a bus power supply, of which one of the plurality of stations is configured as a master having a program, and further stations are configured as slaves, each slave having an output coupled to the bus power supply, the method comprising:

initiating a diagnosis operating mode at the master at a specified or specifiable time;

switching the outputs of all slaves coupled to the bus power supply into specified states according to tie program in the master;

querying the outputs of the slaves in the specified states in succession with regard to one of a short-circuit and an interruption in the slaves;

storing in the master at least one of current and voltage information regarding the outputs of the slaves;

detecting one of a current or voltage value present at a diagnosed output supplied by the bus power supply; and diagnosing the diagnosed output on the basis of the stored information current and the detected at least one of current and voltage state.

* * * * *

UNITED STATES PATENT AND TRADEMARK OFFICE
CERTIFICATE OF CORRECTION

PATENT NO. : 6,542,948 B1
DATED : April 1, 2003
INVENTOR(S) : Juergen Munz et al.

It is certified that error appears in the above-identified patent and that said Letters Patent is hereby corrected as shown below:

<u>Title page, Item [54] and Column 1, line 1,</u>
Change the title to read -- BUS SYSTEM AND METHOD OF DIAGNOSIS OF STATIONS INTERCONNECTED OVER THE BUS SYSTEM --.

<u>Column 4,</u>
Line 35, change "plurality," to -- plurality --.
Line 42, change "least;t" to -- least --.

<u>Column 6,</u>
Line 5, change "arid" to -- and --.

<u>Column 7,</u>
Line 6, change "tie" to -- the --.

Signed and Sealed this

Seventeenth Day of February, 2004

JON W. DUDAS
*Acting Director of the United States Patent and Trademark Office*